(12) United States Patent
Busscher et al.

(10) Patent No.: US 11,600,732 B2
(45) Date of Patent: Mar. 7, 2023

(54) VARIABLE TRANSMITTANCE WINDOW ASSEMBLY

(71) Applicant: Gentex Corporation, Zeeland, MI (US)

(72) Inventors: Bradley L. Busscher, Grand Rapids, MI (US); David I. Driscoll, Caledonia, MI (US)

(73) Assignee: GENTEX CORPORATION, Zeeland, MI (US)

( * ) Notice: Subject to any disclaimer, the term of this patent is extended or adjusted under 35 U.S.C. 154(b) by 529 days.

(21) Appl. No.: 16/736,410

(22) Filed: Jan. 7, 2020

(65) Prior Publication Data

US 2020/0220035 A1    Jul. 9, 2020

Related U.S. Application Data

(60) Provisional application No. 62/789,199, filed on Jan. 7, 2019.

(51) Int. Cl.
| | |
|---|---|
| *H01L 31/0224* | (2006.01) |
| *G05B 15/02* | (2006.01) |
| *E06B 9/24* | (2006.01) |

(52) U.S. Cl.
CPC ........ *H01L 31/022466* (2013.01); *E06B 9/24* (2013.01); *G05B 15/02* (2013.01); *E06B 2009/2464* (2013.01)

(58) Field of Classification Search
None
See application file for complete search history.

(56) References Cited

U.S. PATENT DOCUMENTS

| | | | |
|---|---|---|---|
| 5,274,493 A | 12/1993 | Couput et al. | |
| 6,084,702 A | 7/2000 | Byker et al. | |
| 6,239,898 B1 * | 5/2001 | Byker | G02F 1/157 |
| | | | 359/275 |

(Continued)

FOREIGN PATENT DOCUMENTS

| | | |
|---|---|---|
| CA | 2860069 A1 | 12/2007 |
| CN | 105799468 A | 7/2016 |

(Continued)

*Primary Examiner* — Joshua K Ihezie
(74) *Attorney, Agent, or Firm* — Price Heneveld LLP; Brian James Brewer

(57) ABSTRACT

A window assembly includes an electro-optic assembly that includes a first substrate that defines first and second surfaces, a second substrate that defines third and fourth surfaces, and a seal disposed about a periphery of the first and second substrates. The seal, the first substrate, and the second substrate define a chamber therebetween. A transparent electrode coating is disposed on each of the second surface and the third surface and an electro-optic medium is disposed between the first substrate and the second substrate. A controller is operably coupled with the transparent electrode coating on the second surface and the transparent electrode coating on the third surface and is configured to change a transmittance state of the electro-optic medium. An interface is operably coupled with the controller and allows adjustment of the transmittance state of the electro-optic medium. The interface includes a display that illustrates a selected transmittance state.

17 Claims, 5 Drawing Sheets

(56) References Cited

U.S. PATENT DOCUMENTS

| | | | |
|---|---|---|---|
| 6,597,489 B1* | 7/2003 | Guarr | G02F 1/157 |
| | | | 359/266 |
| 7,525,714 B2 | 4/2009 | Poll et al. | |
| 7,535,614 B1 | 5/2009 | Tapley et al. | |
| 7,990,603 B2 | 8/2011 | Ash et al. | |
| 8,547,624 B2 | 10/2013 | Ash et al. | |
| 9,176,357 B2 | 11/2015 | Lam et al. | |
| 9,606,412 B2* | 3/2017 | Geerlings | G02B 5/1842 |
| 10,023,028 B2* | 7/2018 | Bugno | B64C 1/1492 |
| 10,137,764 B2* | 11/2018 | Driscoll | H04W 4/70 |
| 10,247,996 B2 | 4/2019 | Driscoll et al. | |
| 2002/0075552 A1 | 6/2002 | Poll et al. | |
| 2002/0135881 A1 | 9/2002 | Rukavina et al. | |
| 2006/0274218 A1 | 12/2006 | Xue | |
| 2014/0268288 A1* | 9/2014 | Driscoll | G02F 1/1533 |
| | | | 359/275 |
| 2015/0251746 A1 | 9/2015 | Schmid et al. | |
| 2017/0371222 A1* | 12/2017 | Driscoll | E06B 9/24 |
| 2018/0286908 A1 | 10/2018 | Yamazaki et al. | |
| 2019/0066962 A1 | 2/2019 | Chuang et al. | |
| 2019/0353969 A1 | 11/2019 | Tonar | |

FOREIGN PATENT DOCUMENTS

| | | |
|---|---|---|
| EP | 2128688 A1 | 12/2009 |
| RU | 2343553 C9 | 4/2009 |
| RU | 2610327 C1 | 2/2017 |

* cited by examiner

VARIABLE TRANSMITTANCE WINDOW ASSEMBLY

CROSS-REFERENCE TO RELATED APPLICATION

This application claims priority to and the benefit under 35 U.S.C. § 119(e) of U.S. Provisional Application No. 62/789,199, filed on Jan. 7, 2019, entitled "VARIABLE TRANSMITTANCE WINDOW ASSEMBLY," the disclosure of which is hereby incorporated herein by reference in its entirety.

FIELD OF THE DISCLOSURE

The present disclosure generally relates to a window assembly, and more particularly to a variable transmittance window assembly.

SUMMARY OF THE DISCLOSURE

According to one aspect of the present disclosure, a window assembly includes an electro-optic assembly that includes a first substrate that defines a first surface and a second surface and a second substrate that defines a third surface and a fourth surface. A seal is disposed about a periphery of the first substrate and the second substrate. The seal, the first substrate, and the second substrate define a chamber therebetween. A transparent electrode coating is disposed on each of the second surface and the third surface and an electro-optic medium is disposed between the first substrate and the second substrate. A controller is operably coupled with the transparent electrode coating on the second surface and the transparent electrode coating on the third surface and is configured to change a transmittance state of the electro-optic medium. An interface is operably coupled with the controller and allows adjustment of the transmittance state of the electro-optic medium. The interface includes a display that illustrates a selected transmittance state.

According to another aspect of the present disclosure, a variable window control assembly includes an electro-optic assembly circumscribed by an inner reveal. The electro-optic assembly includes an electro-optic medium configured to dynamically change a transmittance state of the electro-optic assembly. A controller is operably coupled with the electro-optic assembly and is configured to change the transmittance state of the electro-optic assembly. An interface is operably coupled with the controller and disposed on the inner reveal. The interface allows adjustment of the transmittance state of the electro-optic assembly and includes a display with icons that illustrate a selected transmittance state.

According to yet another aspect of the present disclosure, a window assembly includes an electro-optic assembly that includes an electro-optic medium disposed between a first substrate and a second substrate and an electrode coating that is in electrical communication with the electro-optic medium. A controller is operably coupled with the electrode coating and is configured to apply a voltage to the electrode coating that results in a change of transmittance of the electro-optic medium. An interface is operably coupled with the controller and allows adjustment of the transmittance state of the electro-optic medium. The interface includes a display that illustrates a clear transmittance state icon and a darkened transmittance state icon.

These and other features, advantages, and objects of the present disclosure will be further understood and appreciated by those skilled in the art by reference to the following specification, claims, and appended drawings.

DETAILED DESCRIPTION

Figure 1:
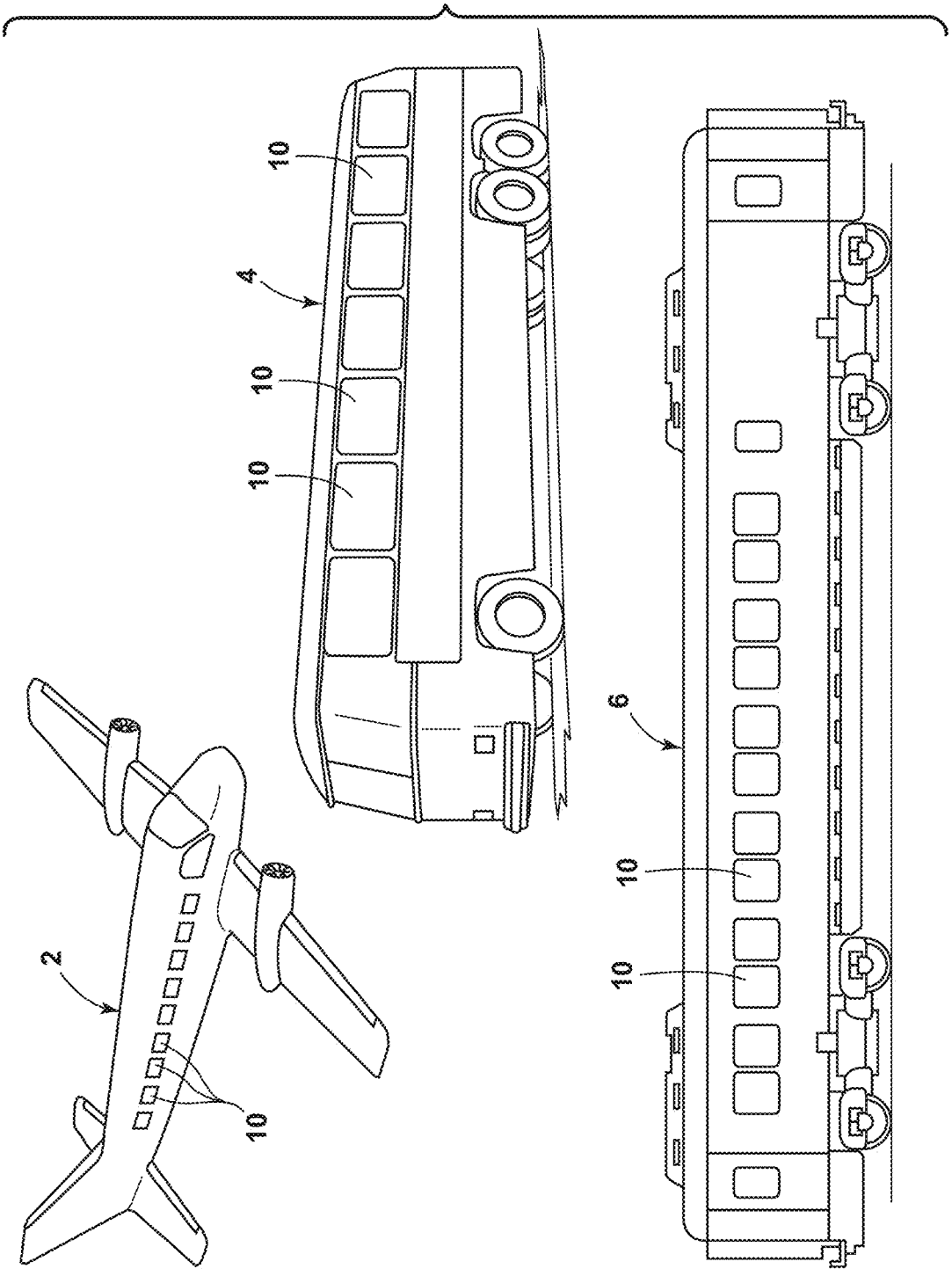
FIG. 1 is a general illustration of multi-passenger vehicles incorporating variable transmittance window assemblies of the present disclosure.

The present illustrated embodiments reside primarily in combinations of method steps and apparatus components related to a window assembly. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

For purposes of description herein, the terms "upper," "lower," "right," "left," "rear," "front," "vertical," "horizontal," and derivatives thereof, shall relate to the disclosure as oriented in FIG. 1. Unless stated otherwise, the term "front" shall refer to the surface of the device closer to an intended viewer of the device, and the term "rear" shall refer to the surface of the device further from the intended viewer of the device. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises a . . . " does not, without more constraints, preclude the existence of additional identical elements in the process, method, article, or apparatus that comprises the element.

Referring to FIGS. 1-4, reference numeral 10 generally designates a window assembly includes an electro-optic assembly 12. The electro-optic assembly 12 includes a first substrate 14 defining a first surface 16 and a second surface 18 and a second substrate 20 defining a third surface 22 and a fourth surface 24. The electro-optic assembly 12 also includes a seal 26 disposed about a periphery 28 of the first substrate 14 and the second substrate 20. The seal 26, the first substrate 14, and the second substrate 20 define a chamber 30 therebetween. The electro-optic assembly 12 further includes a transparent electrode coating 32 disposed on each of the second surface 18 and the third surface 22. An electro-optic medium 34 is disposed between the first substrate 14 and the second substrate 20. A controller 40 is operably coupled with the transparent electrode coating 32 on the second surface 18 and the transparent electrode coating 32 on the third surface 22. The controller 40 is configured to change a transmittance state of the electro-optic medium 34. An interface 42 is operably coupled with the controller 40 and allows adjustment of the transmittance state of the electro-optic medium 34. The interface 42 includes a display 44 that illustrates a selected transmittance state.

With reference again to FIG. 1, the concepts as set forth herein are generally configured for use with multi-passenger vehicles employing variable transmittance window assemblies 10. Mass-transit multi-passenger vehicles that utilize the variable transmittance window assembly 10 may also include, for example, aircraft 2, busses 4, trains 6, among other vehicles. As set forth in detail herein, the multi-passenger vehicles, generally illustrated in FIG. 1, include window control systems designed to allow a user to selectively control a transmission state of the variable transmittance window assembly 10.

Figure 2:
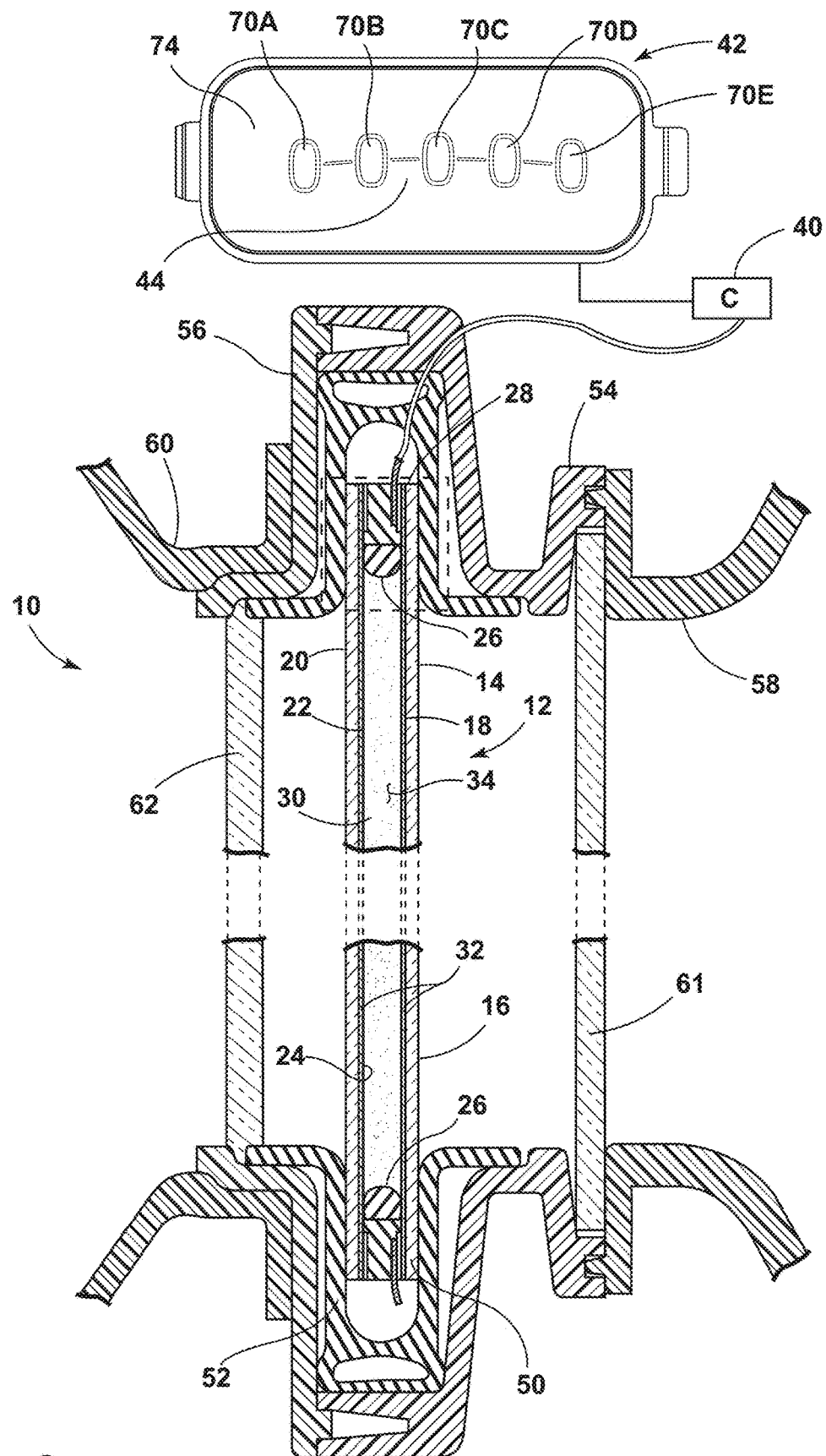
FIG. 2 is a schematic view of a variable transmittance window assembly (in cross-section) and controller interface of the present disclosure.

With reference to FIG. 2, an electro-optic element 50 of the electro-optic assembly 12 generally defines a window and is shown having its perimeter enclosed by an elastomeric bezel 52. The elastomeric bezel 52 and the electro-optic element 50 are secured in place by a middle reveal 54 and an outer reveal 56. The middle reveal 54 and the outer reveal 56, as well as the electro-optic element 50 secured by them, are joined to and secured in place by an inner reveal 58 and an outer mounting structure 60. A dust cover 61 is secured by the inner reveal 58 and the middle reveal 54 and is configured to protect the electro-optic element 50. As shown, the dust cover 61 includes a generally transparent substrate. A pressure pane 62 is disposed on an opposite side of the electro-optic element 50. The elastomeric bezel 52 is composed of a material that is strong enough to retain the electro-optic element 50 in place, while at the same time insulating the electro-optic element 50 from structural stresses and forces applied to the elastomeric bezel 52 by the middle reveal 54, the inner reveal 58, the outer reveal 56, and the outer mounting structure 60. The outer reveal 56 and the middle reveal 54 may be made of a thermally conductive polymeric material. The thermally conductive polymeric material is configured to be strong enough to provide structural support for the electro-optic element 50 and the elastomeric bezel 52, while at the same time diverting excess thermal energy away from the electro-optic element 50 and into the inner reveal 58 and the outer mounting structure 60. When the electro-optic element 50 is in its darkened state, it may absorb light which becomes thermal energy. By utilizing a thermally conductive polymeric material, the excess thermal energy collected from the electro-optic assembly 12 may be dissipated through the reveals 54, 56, 58. By utilizing the elastomeric bezel 52 to reduce the forces to which the electro-optic element 50 is exposed, and by providing the middle reveal 54 and the outer reveal 56 made from a thermally conductive polymeric material to reduce the thermal stresses to which the electro-optic element 50 is subjected, the overall reliability of the electro-optic element 50, and therefore, the variable transmittance window assembly 10, can be enhanced.

Figure 3:
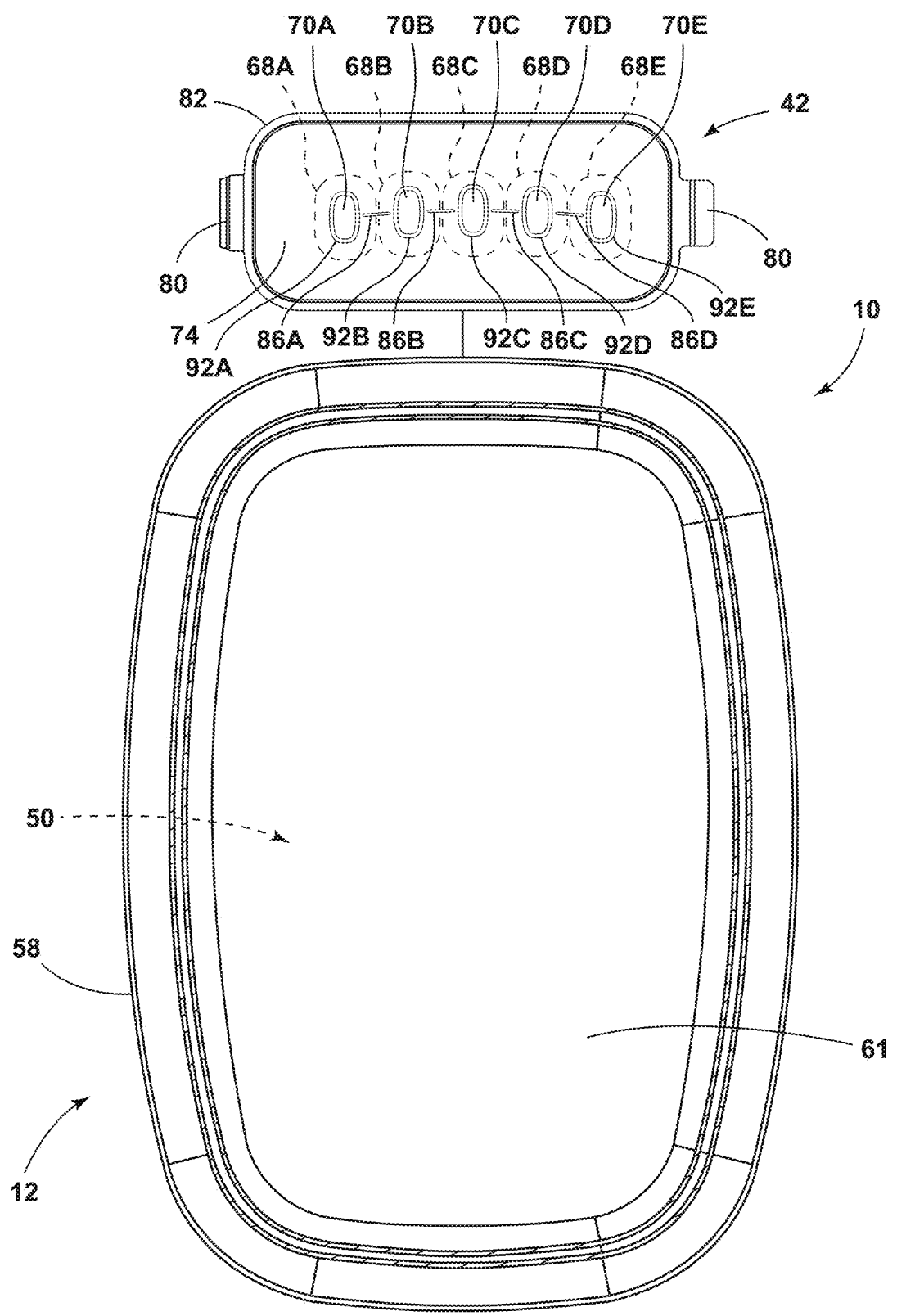
FIG. 3 is a front elevational view of a variable transmittance window assembly and controller interface of the present disclosure.
Figure 4:
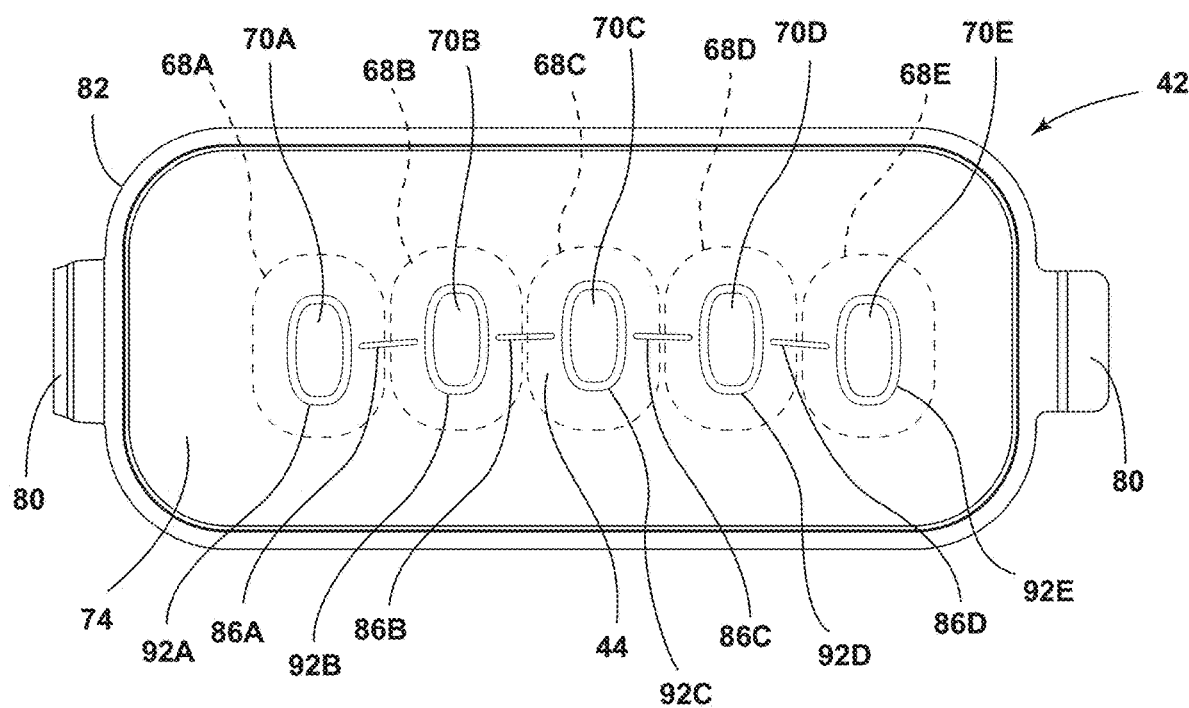
FIG. 4 is an enlarged front elevational view of the controller interface of FIG. 3.

With reference to FIGS. 3-4, the passenger control interface 42 for the variable transmittance window set forth herein may include a variety of features and functions. It is generally contemplated that the passenger control interface 42 will be positioned above the electro-optic element 50. However, the passenger control interface 42 may be positioned on a side of or under the electro-optic element 50. The passenger control interface 42 includes tabs 80 configured to secure the passenger control interface 42 behind the inner reveal 58. A glass panel 74 may be recessed relative to the inner reveal 58, flush with the inner reveal 58, or protrude from the inner reveal 58. A frame 82 of the passenger control interface 42 may be set behind the inner reveal 58. Icons 70A-70E may contain a ring around each of the icons 70A-70E that may be illuminated to indicate the transmission state of the variable transmittance window assembly 10. Dashes 86A-86D are illustrated between icons 70A-70E and may illuminate as the requested transmittance state changes and may also indicate that the user can use a "swiping" action between the icons 70A-70E. The dashes 86A-86D and the icons 70A-70E may be etched into a rear side of the glass panel 74 or the icons 70A-70E and the dashes 86A-86D may be included in separate illuminating devices and/or graphics positioned behind the glass panel 74.

The passenger control interface 42, as illustrated in FIGS. 2 and 3, may include any of a variety of sensors 68A-68E disposed at each of a plurality of icons 70A-70E. The sensors 68A-68E may include capacitive touch functionality. It is generally contemplated that a central area of each of the icons 70A-70E may be an unlit area. Each ring 92A-92E extending around the central area may be configured to illuminate when a light source behind any one of the rings 92A-92E is activated. The sensor area defined by each sensor 68A-68E may generally extend outside each of the rings 92A-92E. The sensor area is the area wherein a selection made by a user can be recognized by the associated sensor 68A-68E. However, it is also contemplated that the sensors 68A-68E may also include proximity sensing, or be free of proximity sensing capabilities. It is generally contemplated that the icons 70A-70E will be positioned under the glass panel 74. In one instance, a far left icon 70A is representative of a clear transmittance state of the electro-optic assembly 12, while a far right icon 70E is representative of a fully darkened transmittance state of the electro-optic assembly 12. The three intermediate icons 70B, 70C, 70D represent the intermediate dimming states of the electro-optic assembly 12. The icons 70A-70E may be back lit by a light source, such that the icons 70A-70E are visible through the glass panel 74 and are easily recognizable by users. In one instance, the back lighting includes two light-emitting diodes (LEDs) for each of the icons 70A-70E, which result in substantial light uniformity through each of the icons 70A-70E. In one instance, the icons 70A-70E include a brightness level of approximately 4 foot-lamberts.

It is generally contemplated that the overall icon brightness will be controlled by a specified configuration database value. A visible light transmission for each LED will include a default illumination value. A brightness of each of the icons 70A-70E may be controlled based on cabin interior light levels and may also vary depending on a transmittance state level. For example, in one instance, the icon 70A may illuminate brighter because there is additional ambient light present (the light transmitted through the electro-optic element 50) and to signify that the icon 70A is associated with the most transmittance available through the electro-optic element 50. The icon 70E, however, may be more dimly lit as there will be less ambient light (the electro-optic element 50 is fully darkened) and to signify that the icon 70E is associated with the darkest state of the electro-optic element 50.

In addition, it is generally contemplated that the controller 40 may be configured to control an illuminance level of each of the icons 70A-70E that is preset by the manufacturer. As previously noted, each of the icons 70A-70E may be directly mapped to an underlying sensor or button (capacitive touch pad) 68A-68E, which correspond to transmittance levels from clear (the leftmost icon 70A) to fully darkened (the rightmost icon 70E). More specifically, capacitive touch pad 68A will be a clear, visible light transmission state, which corresponds to the icon 70A on the left hand side of the passenger control interface 42. Capacitive touch pad 68E will be the fully darkened visible light transmission state, and corresponds to the icon 70E on the right hand side of the passenger control interface 42. A pulse rate of approximately 1 Hz with symmetrical ramp up of 0.5 seconds and ramp down of 0.5 seconds may be utilized. In addition, illumination of each of the icons 70A-70E to follow the path of a finger touch, finger drag, finger slide, or finger swipe may also be implemented. However, it is generally contemplated that only one of the icons 70A-70E may be illuminated at a time. However, subtle transition between the icons 70A-70E may also be possible. If a single touch is present at a particular one of the capacitive icons 70A-70E associated with the sensors 68A-68E, the single icon 70A-70E will be illuminated at the place of touch. The icon 70A-70E that is touched the most may be selected as the default requested transmittance state. If there are two icons 70A-70E (and therefore two sensors 68A-68E) that are touched with the exact same pressure or sensitivity, then the highest visible transmission state will be used as the requested transmittance state. This may again generally be the case in the event of a simultaneous touch event.

With reference again to FIGS. 2 and 3, in one aspect of the present disclosure, the visible light transmission of each of the icons 70A-70E lasts approximately 3,500 milliseconds or 3.5 seconds. The LEDs associated with the current transmittance state at the associated, related icon 70A-70E will be activated. However, prior to selection, none of the transmittance state icons 70A-70E are illuminated. If the requested transmittance state is an unlocked state (this is any state that is not locked out by the controller 40) then the electro-optic assembly 12 remains at the current visible transmittance state that was previously selected or which is a default of the system. The current transmittance state is represented by illumination of the transmittance state icon 70A-70E which illuminates for a predetermined display time. The predetermined display time may be as little as 0 seconds (off) to permanently on, or anything in between. In one instance, the predetermined display time is 3.5 seconds. If the requested transmittance state is a locked state (this is any state that is locked out by the controller 40) then the electro-optic assembly 12 remains at the current transmittance state and the transmittance state icons 70A-70E illuminate for a predetermined display time and then the current transmittance state icon 70A-70E illuminates for the predetermined display time. In the instances noted above, the passenger control interface 42 includes a display time of zero between consecutive touches on the passenger control interface 42. However, it is also contemplated that a display time that is larger than zero but is less than a display time limit may also be utilized. The display time limit may be associated with a predetermined amount of time allotted before the controller 40 performs a wake-up function that shows the user the available transmittance states that are unlocked. The display time limit is defined by a configuration database parameter, which defaults to 30 seconds. If the passenger control interface 42 operation includes a display time that is greater than zero then the requested transmittance state (when unlocked) will transition the electro-optic assembly 12 to the requested transmittance state (without performing the wake-up function) and the requested transmittance state icon 70A-70E will flash for a minimum flash time before subsequently deactivating. The minimum flash time duration may be defined by the manufacturer or may be an actual transmission time. It is also contemplated that there may be a predefined minimum LED blinking time.

In another instance, the visible light transmission state will not be indicated by the related transmittance state icon 70A-70E. The transmittance state icons 70A-70E will remain in a non-illuminated condition until one of the transmittance state icons 70A-70E is selected by the user. In this instance, when the requested transmittance state is an unlocked state, the electro-optic assembly 12 will transition to the requested transmittance state and the transmittance state icon will flash for the minimum flash time that may be pre-selected by the manufacturer. If the requested transmittance state is a locked state, then none of the transmittance state icons 70A-70E are illuminated and the electro-optic assembly 12 remains at the current visible light transmission state. Alternatively, it is also contemplated that upon selection of one of the transmittance state icons 70A-70E, the requested transmittance state, if unlocked, will result in the electro-optic assembly 12 transitioning to the requested transmittance state but with no transmittance state icon feedback provided (no illumination of the related transmittance state icon 70A-70E). Alternatively, if the requested transmittance state is a locked state, then none of the transmittance state icons 70A-70E are illuminated and the electro-optic assembly 12 remains at the current visible light transmission state.

In yet another embodiment, the visible light transmission state is permanently indicated. In this instance, the current transmittance state icon 70A-70E is illuminated continuously to indicate the current visible light transmission state. If the requested transmittance state is an unlocked state, then the electro-optic assembly 12 transitions to the requested transmittance state and the requested transmittance state icon 70A-70E flashes for the minimum flash time and then the requested transmittance state icon 70A-70E illuminates continuously. If the requested transmittance state is a locked state, then the electro-optic assembly 12 remains at the current visible light transmission state and all unlocked state icons illuminate for the minimum flash time. The current state then illuminates continuously after selection. However, in another instance, if the requested transmittance state is an unlocked state, the electro-optic assembly 12 may transition to the requested transmittance state and the requested transmittance state related icon 70A-70E illuminates continuously (without flashing).

Figure 5:
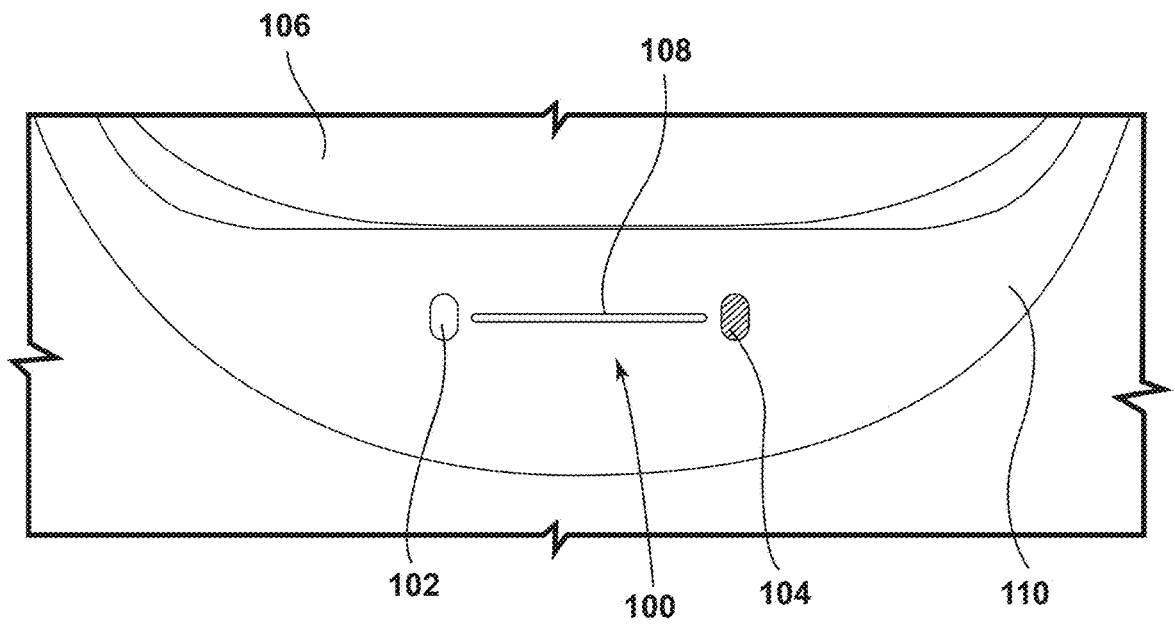
FIG. 5 is an elevational view of a variable window control interface of the present disclosure.
Figure 6:
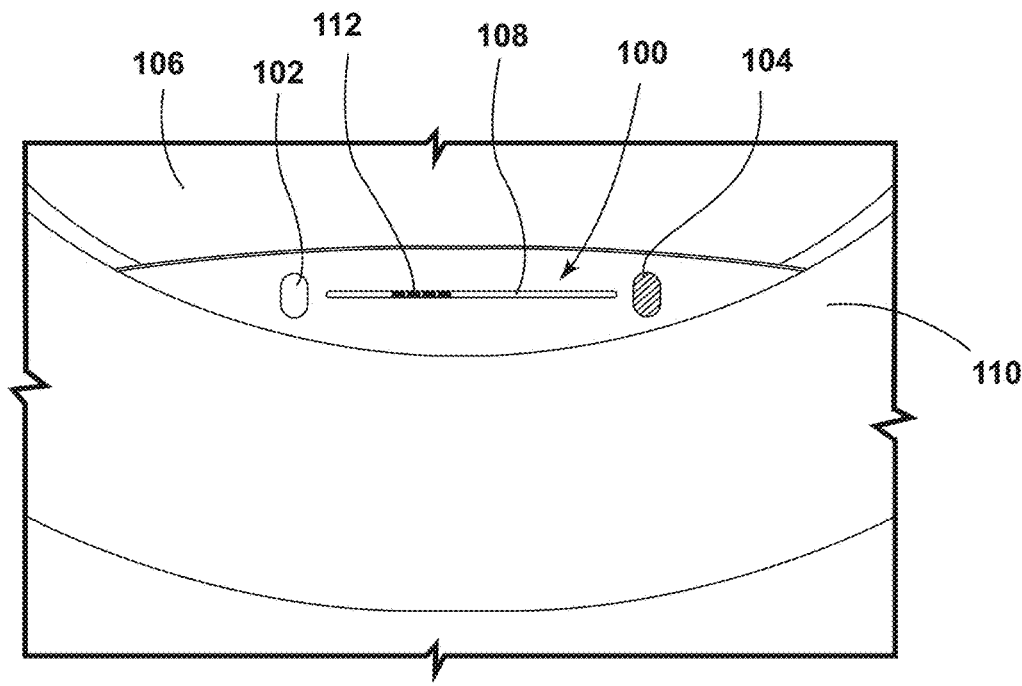
FIG. 6 depicts the variable window control interface of FIG. 5 with icons illuminated through a glass panel.

With reference now to FIGS. 5 and 6, in another aspect of the present disclosure, an illustrated passenger control interface 100 includes functionality allowing for adjusting a light transmittance state of an electro-optic assembly 106 of a dimming window. The passenger control interface 100 includes a clear indication icon 102 (also referred to as a clear transmittance state icon) and a darkened indication icon 104 (also referred to as a darkened transmittance state icon). Each of the clear indication icon 102 and the darkened indication icon 104 are disposed below the electro-optic assembly 106. The electro-optic assembly 106 may include similar structure to that set forth in FIGS. 2-4. A selection bar 108 extends between the clear indication icon 102 and the darkened indication icon 104. The selection bar 108 may include a sensor assembly that includes one or more sensors disposed behind the selection bar 108 and which are configured to detect selection by the user of a particular transmittance state of the electro-optic assembly 106, thereby acting as a slide toggle, such as that set forth in commonly assigned U.S. patent application Ser. No. 16/659,161, filed on Oct. 21, 2019, which published as U.S. patent application Publication Ser. No. 2020/0123845, the contents of which are hereby incorporated by reference in their entirety. More specifically, the selection bar 108 may perform as the slide toggle that includes sensor functionality, such that the user can touch the slide toggle and, using a finger, slide from right to left (from the darkened indication icon 104 to the clear indication icon 102). The change in the capacitance as the finger moves across the slide toggle is detected by the controller 40, which applies less voltage to the electro-optic assembly 106, thereby increasing the transmittance of the electro-optic assembly 106. The opposite function can also be performed. For instance, the user can touch the slide toggle and instead slide a finger from left to right (from the clear indication icon 102 to the darkened indication icon 104). As the finger moves across the slide toggle, the change in the capacitance is detected by the controller 40 and the controller 40 increases the voltage applied to the electro-optic medium 34 of the electro-optic assembly 106 and the transmittance of the electro-optic assembly 106 decreases. The sensor assembly may also include one or more sensors aligned with each of the clear indication icon 102, the darkened indication icon 104, and any intermediary transmittance state icons that define a detection area that is larger than each of the clear indication icon 102, the darkened indication icon 104, and any intermediary transmittance state icons.

As shown in FIG. 5, the passenger control interface 100 may be positioned on an inner reveal 110 adjacent to the electro-optic assembly 106. It will be understood that the passenger control interface 100 may also be disposed on a side of the electro-optic assembly 106 or above the electro-optic assembly 106. In addition, it will be understood that a plurality of light sources, for example LEDs, may be disposed within the selection bar 108 and which represent a selected status of the transmittance selected by the user. It will be understood that the light source may illuminate for a predetermined period of time upon selection, or adjustment, or may be permanently illuminated to provide a visual indicator to the user of a selected or current transmittance state of the electro-optic assembly 106.

As shown in FIG. 6, the passenger control interface 100 may also be disposed above the inner reveal 110 of the window assembly in front of a portion of the electro-optic assembly. A selected transmittance state is illustrated as light sources 112 of FIG. 6. As previously noted, a user can simply touch the selection bar 108 and adjust the light transmittance of the electro-optic assembly 106 to a clear state by dragging a finger to the left. Alternatively, the user can drag a finger to the right after touching the selection bar 108, which will result in the light sources 112 closer to the darkened indicator icon 104 to illuminate and the electro-optic assembly 106 to darken.

It will be understood by one having ordinary skill in the art that construction of the described disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further it is to be understood that such concepts are intended to be covered by the following claims unless these claims by their language expressly state otherwise.

What is claimed is:
1. A window assembly comprising:
an electro-optic assembly comprising:
a first substrate defining a first surface and a second surface;
a second substrate defining a third surface and a fourth surface;

a seal disposed about a periphery of the first substrate and the second substrate, wherein the seal, the first substrate, and the second substrate define a chamber therebetween; and a transparent electrode coating disposed on each of the second surface and the third surface;

an electro-optic medium disposed between the first substrate and the second substrate;

a controller operably coupled with the transparent electrode coating on the second surface and the transparent electrode coating on the third surface, the controller configured to change a transmittance state of the electro-optic medium;

an interface operably coupled with the controller and which allows adjustment of the transmittance state of the electro-optic medium, the interface including a display that illustrates a clear transmittance state, at least one intermediate transmittance state, and a fully darkened transmittance state;

a plurality of icons disposed on the display that illustrate different transmittance states, wherein the plurality of icons include an icon representative of the clear transmittance state, at least one icon representative of the at least one intermediate transmittance state, and an icon representative of the fully darkened transmittance state;

a first sensor disposed at the icon representative of the clear transmittance state, the first sensor defining a sensor area that is larger than a periphery of the icon representative of the clear transmittance state; and a second sensor disposed at the icon representative of the fully darkened transmittance state, the second sensor defining a sensor area that is larger than a periphery of the icon representative of the fully darkened state.

2. The window assembly of claim 1, wherein the plurality of icons are back lit.

3. The window assembly of claim 1, wherein each of the plurality of icons includes a capacitive sensor.

4. The window assembly of claim 1, wherein the plurality of icons are illuminated through a glass panel.

5. A variable window control assembly comprising:
an electro-optic assembly circumscribed by an inner reveal and including an electro-optic medium configured to dynamically change a transmittance state of the electro-optic assembly;

a controller operably coupled with the electro-optic assembly and configured to change the transmittance state of the electro-optic assembly;

an interface operably coupled with the controller and disposed on the inner reveal, wherein the interface allows adjustment of the transmittance state of the electro-optic assembly, the interface including a display with icons that illustrate a clear transmittance state, an intermediate transmittance state, and a dark transmittance state;

a first sensor disposed at the icon that illustrates the clear transmittance state, the first sensor defining a sensor area that is larger than a periphery of the icon that illustrates the clear transmittance state; and a second sensor disposed at the icon that illustrates the dark transmittance state, the second sensor defining a sensor area that is larger than a periphery of the icon that illustrates the dark transmittance state.

6. The variable window control assembly of claim 5, wherein the icons include a clear icon and a full dark icon.

7. The variable window control assembly of claim 5, wherein the icons are back lit.

8. The variable window control assembly of claim 7, wherein the icons are illuminated through a glass panel.

9. The variable window control assembly of claim 5, wherein each icon includes a capacitive sensor.

10. A window assembly comprising:
an electro-optic assembly including an electro-optic medium disposed between a first substrate and a second substrate;

an electrode coating in electrical communication with the electro-optic medium;

a controller operably coupled with the electrode coating, the controller configured to apply a voltage to the electrode coating resulting in a change of transmittance of the electro-optic medium;

an interface operably coupled with the controller and which allows adjustment of the transmittance state of the electro-optic medium, the interface including a display that illustrates a clear transmittance state icon, a plurality of intermediate transmittance state icons and a darkened transmittance state icon;

a first sensor disposed at the clear transmittance state icon, the first sensor defining a sensor area that is larger than a periphery of the clear transmittance state icon; and a second sensor disposed at the darkened transmittance state icon, the second sensor defining a sensor area that is larger than a periphery of the darkened transmittance state icon.

11. The window assembly of claim 10, wherein a plurality of icons are disposed on an inner reveal adjacent to the electro-optic assembly.

12. The window assembly of claim 10, further comprising:
a selection bar extending between the clear transmittance state icon and the darkened transmittance state icon.

13. The window assembly of claim 12, wherein the selection bar includes a plurality of light sources configured to provide a visual indicator of a selected transmittance state of the electro-optic assembly.

14. The window assembly of claim 12, wherein the selection bar includes a sensor assembly configured to detect a selected transmittance of a user.

15. The window assembly of claim 12, wherein the selection bar functions as a slide toggle.

16. The window assembly of claim 11, wherein the plurality of icons are illuminated through a glass panel.

17. The window assembly of claim 11, wherein the plurality of intermediate transmittance state icons are positioned between the clear transmittance state icon and the darkened transmittance state icon.

* * * * *